US010928435B2

(12) United States Patent
Severns et al.

(10) Patent No.: US 10,928,435 B2
(45) Date of Patent: Feb. 23, 2021

(54) ELECTRICAL FAULT DETECTOR AND METHOD OF USE

(71) Applicant: THE BOEING COMPANY, Chicago, IL (US)

(72) Inventors: Christopher Mark Severns, Sammamish, WA (US); Vyacheslav Khozikov, Bellevue, WA (US)

(73) Assignee: THE BOEING COMPANY, Chicago, IL (US)

( * ) Notice: Subject to any disclaimer, the term of this patent is extended or adjusted under 35 U.S.C. 154(b) by 58 days.

(21) Appl. No.: 16/511,984

(22) Filed: Jul. 15, 2019

(65) Prior Publication Data
US 2021/0018550 A1    Jan. 21, 2021

(51) Int. Cl.
G01R 31/11    (2006.01)
G01D 5/40    (2006.01)
G01D 5/353    (2006.01)
G01R 31/58    (2020.01)

(52) U.S. Cl.
CPC .......... G01R 31/11 (2013.01); G01D 5/35306 (2013.01); G01D 5/40 (2013.01); G01R 31/58 (2020.01)

(58) Field of Classification Search
CPC ........ G01R 31/11; G01R 31/52; G01R 31/58; G01R 31/085; G01R 31/2812; G01D 5/35306; G01D 5/40
See application file for complete search history.

(56) References Cited

U.S. PATENT DOCUMENTS

| 4,532,499 | A |   | 7/1985  | Collin et al.  |            |
|-----------|---|---|---------|----------------|------------|
| 4,747,036 | A |   | 5/1988  | Ichikawa et al.|            |
| 4,878,144 | A |   | 10/1989 | Nebon          |            |
| 5,202,812 | A |   | 4/1993  | Shinoda et al. |            |
| 5,365,175 | A |   | 11/1994 | Patterson et al.|           |
| 5,475,371 | A |   | 12/1995 | Dunk et al.    |            |
| 5,616,895 | A | * | 4/1997  | Spiess ..................... | B66B 13/22 |
|           |   |   |         |                | 187/280    |
| 6,229,680 | B1|   | 5/2001  | Shea           |            |
| 6,492,800 | B1| * | 12/2002 | Woods .................. | G01R 1/071 |
|           |   |   |         |                | 324/96     |
| 7,142,291 | B2|   | 11/2006 | Sarkozi et al. |            |
| 7,767,957 | B2|   | 8/2010  | Viehmann       |            |
| 7,876,448 | B2|   | 1/2011  | Andersson et al.|           |

(Continued)

FOREIGN PATENT DOCUMENTS

| EP | 0277623 A3 | 8/1988 |
| EP | 0455562 B1 | 6/1995 |
| WO | 2017209703 A1 | 12/2017 |

Primary Examiner — Thang X Le
(74) Attorney, Agent, or Firm — Armstrong Teasdale LLP

(57) ABSTRACT

An electrical system is provided. The electrical system includes an insulated electrical conductor installed in an aircraft and configured to conduct a current over a length of the insulated electrical conductor. The electrical system includes an optical fiber includes a jacket surrounding an optical core, the optical fiber installed adjacent to the insulated electrical conductor. The electrical system includes a photo detector coupled to the optical fiber and configured to detect an electromagnetic signal carried by the optical fiber and at least partially generated as a function of an electrical fault that occurs at a point along the length of the insulated electrical conductor.

20 Claims, 2 Drawing Sheets

(56) References Cited

U.S. PATENT DOCUMENTS

| | | |
|---|---|---|
| 8,223,466 B2 | 7/2012 | Roscoe |
| 8,949,054 B2 | 2/2015 | Bjorn |
| 9,509,399 B2 | 11/2016 | Kasztenny et al. |
| 9,820,017 B2 | 11/2017 | Hunter et al. |
| 2003/0103211 A1* | 6/2003 | Lange .................... G01K 11/32 356/479 |
| 2010/0092127 A1* | 4/2010 | Sasaoka ............... G01M 11/085 385/12 |
| 2011/0115469 A1 | 5/2011 | Kondo et al. |
| 2017/0054495 A1 | 2/2017 | Kasztenny et al. |

* cited by examiner

ELECTRICAL FAULT DETECTOR AND METHOD OF USE

FIELD

The field of the disclosure relates generally to detection of electrical faults in electrical conductors, and more specifically to an electrical fault detector and a method of use.

BACKGROUND

Many electrical systems may suffer from occasional or intermittent electrical faults, such as electrical arcs or corona discharges where air surrounding an electrical conductor is ionized. Such electrical faults can compromise electrical conductors by degrading insulation and reducing the useful life of the electrical conductor. Electrical faults may, in certain circumstances, trigger an overcurrent protection that results in, for example, de-energizing one or more electrical conductors. However, corona discharges are generally of such low energy that overcurrent protection is not engaged. Many electrical faults are only revealed, if ever, by a manual visual inspection of the length of the electrical conductor and, even then, it may be difficult to identify the location of, or localize, the electrical fault, for example, the location of an electrical arc or a corona discharge along the length of the electrical conductor.

It is desirable to improve the detection of electrical faults in and protection of electrical conductors. It is further desirable to improve localization of such electrical faults.

BRIEF DESCRIPTION

According to one aspect of the present disclosure, an electrical system is provided. The electrical system includes an insulated electrical conductor installed in an aircraft and configured to conduct a current over a length of the insulated electrical conductor. The electrical system includes an optical fiber includes a jacket surrounding an optical core, the optical fiber installed adjacent to the insulated electrical conductor. The electrical system includes a photo detector coupled to the optical fiber and configured to detect an electromagnetic signal carried by the optical fiber and at least partially generated as a function of an electrical fault that occurs at a point along the length of the insulated electrical conductor.

According to another aspect of the present disclosure, an electrical fault detector is provided. The electrical fault detector includes an optical fiber, a photo detector, and a processor. The optical fiber includes a jacket surrounding an optical core. The optical fiber is configured to be installed adjacent to an insulated electrical conductor installed in an aircraft and is configured to conduct a current over a length of the insulated electrical conductor. The photo detector is coupled to the optical fiber and is configured to detect an electromagnetic signal carried by the optical fiber and at least partially generated as a function of an electrical fault that occurs at a point along the length of the insulated electrical conductor. The photo detector is further configured to transmit an electrical signal indicative of detecting the electromagnetic signal. The processor is coupled to the photo detector and is configured to receive the electrical signal and determine the electrical fault has occurred in response to the electrical signal.

According to yet another aspect of the present disclosure, a method of detecting an electrical fault occurring at a point along a length of an insulated electrical conductor installed in an aircraft is provided. The method includes installing an optical fiber adjacent to the insulated electrical conductor, where the optical fiber includes a jacket material configured to degrade at a location proximate the electrical fault in response to the electrical fault. The method includes receiving, at a photo detector coupled to the optical fiber, an electromagnetic signal carried by the optical fiber and at least partially generated as a function of the electrical fault. The method includes transmitting an electrical signal indicative of detecting the electromagnetic signal to a processor coupled to the photo detector. The method includes determining, by the processor, the electrical fault has occurred in response to the electrical signal.

The features, functions, and advantages that have been discussed can be achieved independently in various embodiments or may be combined in yet other embodiments further details of which can be seen with reference to the following description and drawings.

DETAILED DESCRIPTION

Figure 1:
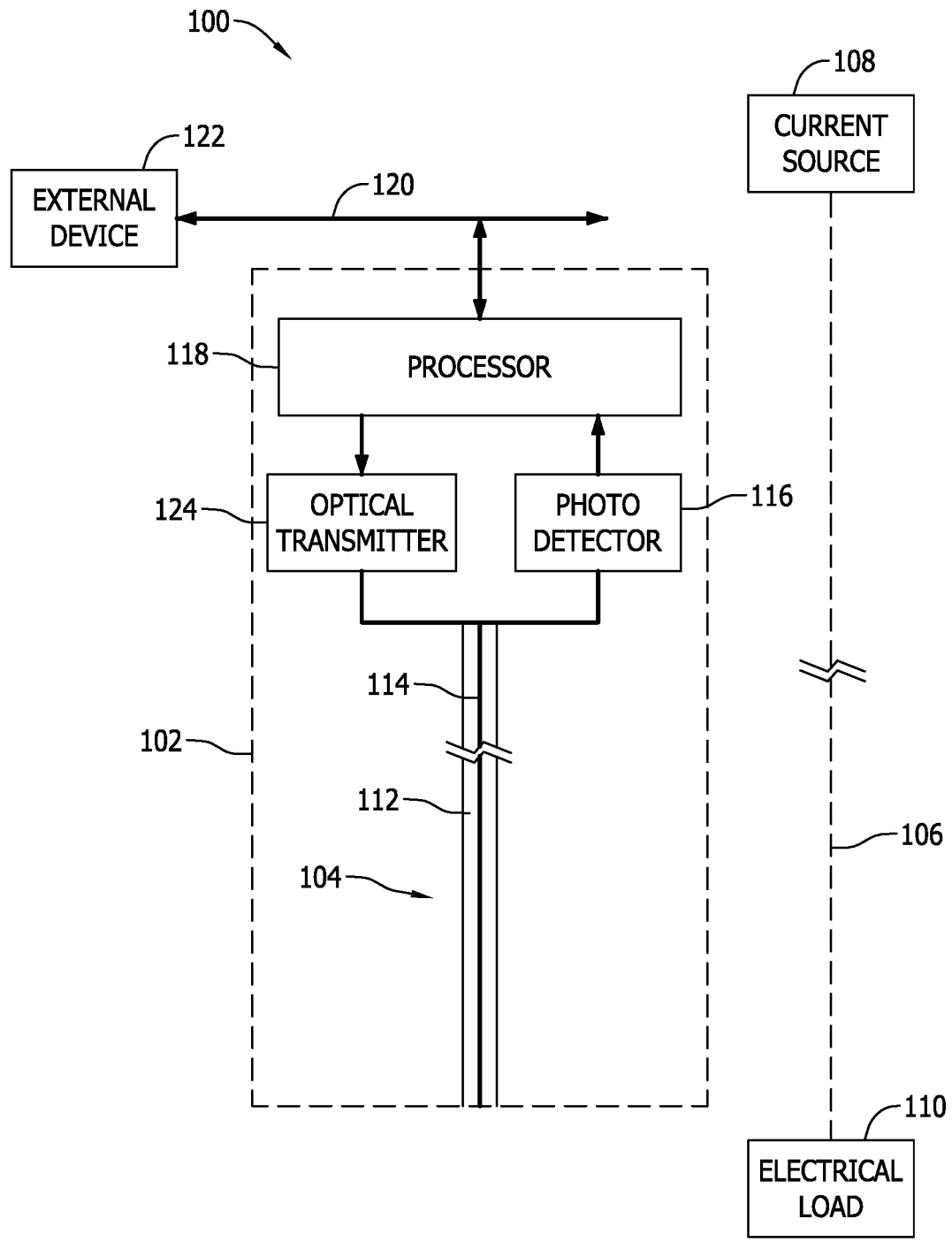
FIG. 1 is a schematic diagram of an example electrical system including an example electrical fault detector.

As used herein, an element or step recited in the singular and preceded by the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Embodiments of the electrical fault detectors and methods described herein enable detection of an electrical fault occurring on an electrical conductor installed in, for example, an aircraft. More specifically, the electrical fault detectors described herein provide an optical fiber installed adjacent to, or co-located with, the electrical conductor. Such electrical conductors may include, for example, one or more power feeders coupled to some current source, such as a battery or generator. Generally, the electrical conductors are insulated, or jacketed, and conduct current from a current source to an electrical load. In at least some aircraft, the insulated electrical conductors are often routed through spaces and plenums that are difficult to gain access to due to their small size or remote location from maintenance hatches and access points. Moreover, the length of the electrical conductor makes visual inspection even more difficult and time consuming.

The electrical fault detector described herein utilize an optical fiber having an optical core, such as a glass or plastic optical fiber, and a jacket composed of a jacket material. The jacket material is one that is sensitive to heat or radiated energy that may be produced when an electrical fault occurs. For example, an electrical arc or corona discharge will result in heating of the jacket material in a location proximate to the location of the electrical fault itself along the length of the electrical conductor. Such heat or emitted energy vaporizes, or at least degrades, the jacket material of the optical fiber, resulting in the generation or at least partial generation, or modification, of an electromagnetic signal carried by the optical fiber. For example, in certain embodiments, the optical fiber carries no electromagnetic signal during normal operation; however, when an electrical fault occurs an electromagnetic signal, such as a light wave, is injected into the optical fiber and propagates through the optical fiber. In other embodiments, the optical fiber carries a base electromagnetic signal that is injected by, for example, an optical transmitter and propagates through the optical fiber. When an electrical fault occurs, the base electromagnetic signal is disrupted, or modified, such that the resulting electromagnetic signal carried by the optical fiber is at least partially generated by the electrical fault. For example, the electrical fault may result in one or more electromagnetic waves being injected into the optical fiber resulting in constructive interference, destructive interference, or a combination of both with the base electromagnetic signal.

The electrical fault detectors described herein also provide a photo detector coupled to the optical fiber and that detects the electromagnetic signal carried by the optical fiber. The photo detector generates an electrical signal indicative of the detected electromagnetic signal from the optical fiber. The electrical fault detectors described herein also provide a processor coupled to the photo detector and optical transmitter. The processor determines the electrical fault has occurred based on the electromagnetic signal. In certain embodiments, the processor may further instruct the optical transmitter to transmit a measurement signal or an identification signal through the optical fiber to determine the location of the electrical fault along the length of the electrical conductor based on optical time-domain reflectometry or by illuminating the location of the electrical fault with a frequency band of light, such as infrared.

The electrical fault detectors described herein also, in certain embodiments, initiate remedial action in response to detecting an electrical fault. For example, in certain embodiments, the electrical fault detector and, more specifically, the processor initiates a maintenance message for the electrical conductor. In certain embodiments, the electrical fault detector initiates a de-energizing of the electrical conductor. Further, in certain embodiments, the electrical fault detector is combined with another fault detection system, such as an acoustic sensor system, and the processor determines the electrical fault has occurred based on both detection by the photo detector and detection by the acoustic sensor system.

FIG. 1 is a schematic diagram of an example electrical system 100 including an example electrical fault detector 102. Electrical fault detector 102 includes an optical fiber 104 installed adjacent to, or co-located with, an insulated electrical conductor 106. As such, optical fiber 104 has a length extending substantially parallel to the length of insulated electrical conductor 106. In certain embodiments, optical fiber 104 and insulated electrical conductor 106 are independent cables, or wires. In other embodiments, optical fiber 104 and insulated electrical conductor 106 may be integrated into a single wire assembly, for example, where each shares a common jacket, or coating, material.

Insulated electrical conductor 106 is one that is installed in, for example, an aircraft and is configured to conduct a current over a length of the insulated conductor, for example, from a current source 108 to some electrical load 110.

Optical fiber 104 includes a jacket 112 surrounding an optical core 114. Optical core 114 may include, for example, a glass optical fiber or a plastic optical fiber. Jacket 112 includes a jacket material that is sensitive to heat and radiant energy emitted by an electrical fault at some point along insulated electrical conductor 106. When an electrical fault occurs, the jacket material degrades as a result of the heat and radiant energy at a location proximate the electrical fault itself. For example, the jacket material is configured to degrade in response to an electrical arc or a corona discharge. When jacket 112 degrades, the electrical fault is able to at least partially generate an electromagnetic signal that is then carried by optical core 114. For example, the electrical arc or corona discharge may create a new electromagnetic wave, or light wave, that is injected onto optical core 114. Where no other electromagnetic signal is being carried by optical fiber 104, the generated electromagnetic signal is itself carried and its detection indicates an electrical fault has occurred. In the alternative, where a base electromagnetic signal is carried by optical fiber 104, the generated electromagnetic signal combines with the base signal, e.g., via constructive or destructive interference, to produce an electromagnetic signal that is at least partially generated by the electrical fault and is carried by optical fiber 104.

Electrical fault detector 102 includes a photo detector 116 coupled to optical fiber 104. Photo detector 116 may include, for example, one or more photo transistors or one or more photo diodes. Photo detector 116, generally, detects an electromagnetic signal, such as light, carried by optical fiber 104 and generates a corresponding electrical signal representing, or indicative of, the detected electromagnetic signal.

Electrical fault detector 102 includes a processor 118 coupled to photo detector 116. Processor 118 receives the electrical signal generated by photo detector 116 and determines whether or not an electrical fault has occurred on insulated electrical conductor 106. When an electrical fault is determined to have occurred, processor 118 may initiate a maintenance message for insulated electrical conductor 106. Processor 118, in at least some embodiments, is coupled to a communication bus 120 that is further coupled to an external device 122, such as, for example, a maintenance computer, a memory device storing a maintenance log, a mission computer, or any other suitable computing system with which processor 118 may communicate for the purpose of relaying the maintenance message for insulated electrical conductor 106. In certain embodiments, processor 118 may de-energize, or at least initiate a de-energizing, insulated electrical conductor 106 in response to detection of the electromagnetic signal carried by optical fiber 104.

Certain embodiments of electrical fault detector 102 include an optical transmitter 124. Optical transmitter 124 is coupled to optical fiber 104 and is configured to transmit one or more electromagnetic signals through optical fiber 104. Optical transmitter 124 may include, for example, a voltage-to-frequency converter and a laser diode. In certain embodiments, optical fiber 104 may be terminated such that optical transmitter 124 is at a first end and photo detector 116 is at a second end. In certain embodiments, optical transmitter 124 and photo detector 116 may be co-located and optical fiber 104 is installed in a loop configuration. In the alternative, optical transmitter 124 and photo detector 116 may be remote from each other and optical fiber 104 spans between them. In certain embodiments, electromagnetic signals are transmitted by optical transmitter 124 at the first end and received by photo detector 116 and the second end. In other embodiments, optical transmitter 124 and photo detector 116 may be terminated at a same end of optical fiber 104, and electromagnetic signals transmitted by optical transmitter 124 may propagate through optical fiber 104, reflect at some termination or impedance mismatch, and return to the same end for detection by photo detector 116.

In certain embodiments, optical transmitter 124 transmits a base signal through optical fiber 104. During normal operation, photo detector 116 detects the base signal, generates a corresponding electrical signal that is transmitted to processor 118, and processor 118 determines no electrical fault has occurred. When an electrical fault occurs and jacket 112 of optical fiber is degraded, a new electromagnetic signal is injected onto optical fiber 104 that combines with the base signal transmitted by optical transmitter 124. The resulting electromagnetic signal, at least partially generated by the electrical fault, is then detected by photo detector 116. Photo detector 116 transmits a corresponding electrical signal to processor 118, and processor 118 determines the electrical fault has occurred by determining the difference between the electromagnetic signal carried by optical fiber 104 and the base signal. Such differences may be in phase, frequency, amplitude, or any combination thereof.

In certain embodiments, optical transmitter 124 transmits a measurement signal through optical fiber 104 in response to detecting the electromagnetic signal carried by optical fiber 104. For example, when an electrical fault is determined to have occurred, processor 118 may, in certain embodiments, instruct optical transmitter 124 to transmit the measurement signal. When the measurement signal propagates to the location of the electrical fault on insulated electrical conductor 106 and subsequent degradation of jacket 112 of optical fiber 104, the measurement signal at least partially reflects due to the impedance change at that point along the length of optical fiber 104. Photo detector 116 is configured to detect the reflection and transmits a corresponding electrical signal to processor 118. Based on the reflection and, more specifically, the timing of the transmission by optical transmitter 124 and detection by photo detector 116, processor 118, using optical time-domain reflectometry, determines a location of the electrical fault along the length of insulated electrical conductor 106.

In certain embodiments, optical transmitter 124 transmits an identification signal through optical fiber 104 in response to detecting the electromagnetic signal carried by optical fiber 104. For example, when an electrical fault is determined to have occurred, processor 118 may, in certain embodiments, instruct optical transmitter 124 to transmit the identification signal to illuminate a location of the electrical fault along the length of insulated electrical conductor 106 using at least one frequency band of light. For example, optical transmitter 124 may generate an infrared identification signal that, when it reaches the location of the degradation in jacket 112, will emit from optical core 114 in a manner that may be manually detected by a user, such as maintenance personnel.

Figure 2:
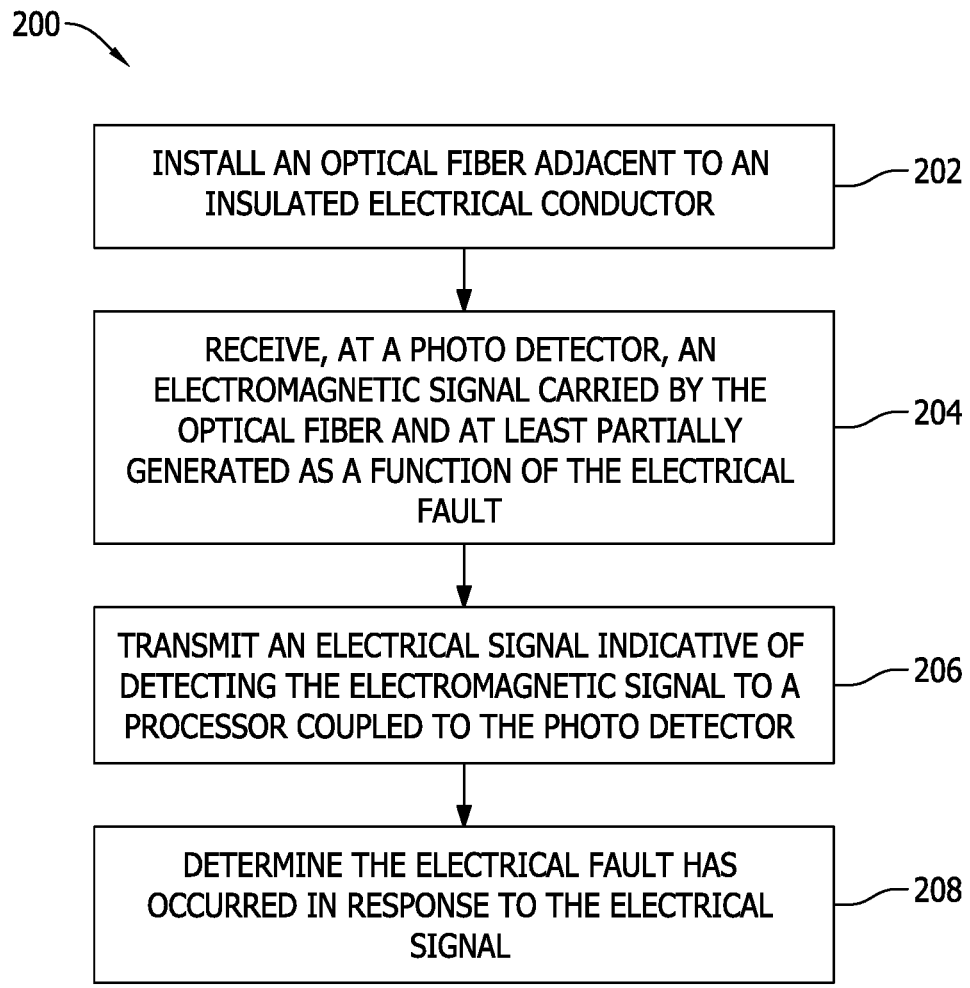
FIG. 2 is a flow diagram of an example method of detecting an electrical fault.

FIG. 2 is a flow diagram of an example method 200 of detecting an electrical fault at a point along the length of insulated electrical conductor 106 installed in, for example, an aircraft. Method 200 includes installing 202 optical fiber 104 adjacent to insulated electrical conductor 106, such that the jacket material of jacket 112 is configured to degrade at a location proximate the electrical fault in response to the electrical fault. Photo detector 116 receives 204 an electromagnetic signal carried by optical fiber 104 and at least partially generated as a function of the electrical fault. Photo detector 116 then transmits 206 an electrical signal, or a corresponding electrical signal, indicative of detecting the electromagnetic signal. The electrical signal is transmitted 206 to processor 118. Processor 118 then determines 208 the electrical fault has occurred in response to the electrical signal.

In certain embodiments, method 200 includes optical transmitter 124 transmitting a base signal through optical fiber 104. When the electrical fault occurs and jacket 112 is degraded, the electrical fault generates a new electromagnetic signal that combines with the base signal, such that the electromagnetic signal carried by optical fiber 104 is at least partially generated by the electrical fault, or as a function of the electrical fault.

In certain embodiments, method 200 includes optical transmitter 124 transmitting a measurement signal through optical fiber 104 in response to detecting the electromagnetic signal and determining the electrical fault has occurred. Processor 118 then determines a location of the electrical fault along the length of insulated electrical conductor 106 based on an optical time-domain reflectometry measurement using the measurement signal.

In certain embodiments, method 200 includes optical transmitter 124 transmitting an identification signal through optical fiber 104 in response to detecting the electromagnetic signal and determining the electrical fault has occurred. The identification signal is configured to illuminate a location of the electrical fault along the length of insulated electrical conductor 106 using at least one frequency band of light, such as the infrared band.

In certain embodiments, method 200 includes initiating a maintenance message for insulated electrical conductor 106 in response to determining the electrical fault has occurred. In certain embodiments, method 200 includes de-energizing insulated electrical conductor 106, or at least initiating de-energizing insulated electrical conductor 106, in response to determining the electrical fault has occurred.

An exemplary technical effect of the methods, systems, and apparatus described herein includes at least one of: (a) improving detection of electrical faults in electrical conductors using an adjacently installed, or co-located, optical fiber electrical fault detector; (b) enabling degradation of jacket material on an optical fiber in response to an electrical fault; (c) detecting electromagnetic signals carried by an optical fiber at least partially generated by an electrical fault in an adjacently installed, or co-located, electrical conductor; (d) improving protection of electrical conductors by detecting electrical faults and initiating remedial action such as maintenance messages or de-energizing electrical conductors; (e) identifying a location of, or localizing, an electrical fault in an electrical conductor using optical time-domain reflectometry in an adjacently installed, or co-located, optical fiber, or by illuminating the location of the electrical fault using at least one frequency band of light; and (f) reducing expense of and time required to carry out maintenance on electrical wiring systems.

Some embodiments involve the use of one or more electronic processing or computing devices. As used herein, the terms "processor" and "computer" and related terms, e.g., "processing device," "computing device," and "controller" are not limited to just those integrated circuits referred to in the art as a computer, but broadly refers to a processor, a processing device, a controller, a general purpose central processing unit (CPU), a graphics processing unit (GPU), a microcontroller, a microcomputer, a programmable logic controller (PLC), a reduced instruction set computer (RISC) processor, a field programmable gate array (FPGA), a digital signal processing (DSP) device, an application specific integrated circuit (ASIC), and other programmable circuits or processing devices capable of executing the functions described herein, and these terms are used interchangeably herein. The above embodiments are examples only, and thus are not intended to limit in any way the definition or meaning of the terms processor, processing device, and related terms.

In the embodiments described herein, memory may include, but is not limited to, a non-transitory computer-readable medium, such as flash memory, a random access memory (RAM), read-only memory (ROM), erasable programmable read-only memory (EPROM), electrically erasable programmable read-only memory (EEPROM), and non-volatile RAM (NVRAM). As used herein, the term "non-transitory computer-readable media" is intended to be representative of any tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal. Alternatively, a floppy disk, a compact disc-read only memory (CD-ROM), a magneto-optical disk (MOD), a digital versatile disc (DVD), or any other computer-based device implemented in any method or technology for short-term and long-term storage of information, such as, computer-readable instructions, data structures, program modules and sub-modules, or other data may also be used. Therefore, the methods described herein may be encoded as executable instructions, e.g., "software" and "firmware," embodied in a non-transitory computer-readable medium. Further, as used herein, the terms "software" and "firmware" are interchangeable, and include any computer program stored in memory for execution by personal computers, workstations, clients and servers. Such instructions, when executed by a processor, cause the processor to perform at least a portion of the methods described herein. The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose various embodiments, which include the best mode, to enable persons skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical system, comprising:
   an insulated electrical conductor installed in an aircraft and configured to conduct a current over a length of the insulated electrical conductor;
   an optical fiber comprising a jacket surrounding an optical core, the optical fiber installed adjacent to the insulated electrical conductor; and
   a photo detector coupled to the optical fiber and configured to detect an electromagnetic signal carried by the optical fiber and at least partially generated as a function of an electrical fault that occurs at a point along the length of the insulated electrical conductor.

2. The electrical system of claim 1 further comprising:
   an optical transmitter coupled to the optical fiber and configured to transmit a base signal through the optical fiber; and
   a processor coupled to the optical transmitter and the photo detector, the processor configured to detect a difference between the base signal and the electromagnetic signal at least partially generated as a function of the electrical fault.

3. The electrical system of claim 1 further comprising:
   an optical transmitter coupled to the optical fiber and configured to transmit a measurement signal through the optical fiber in response to detecting the electromagnetic signal; and
   a processor coupled to the optical transmitter and the photo detector, the processor configured to determine a location of the electrical fault along the length of the insulated electrical conductor based on an optical time-domain reflectometry measurement using the measurement signal.

4. The electrical system of claim 1 further comprising an optical transmitter coupled to the optical fiber and configured to transmit an identification signal through the optical fiber in response to detecting the electromagnetic signal, the identification signal configured to illuminate a location of the electrical fault along the length of the insulated electrical conductor using at least one frequency band of light.

5. The electrical system of claim 4, wherein the at least one frequency band of light is infrared.

6. The electrical system of claim 1 further comprising a processor coupled to the photo detector and configured to initiate a maintenance message for the insulated electrical conductor in response to detecting the electromagnetic signal.

7. The electrical system of claim 1 further comprising a processor coupled to the photo detector and configured to de-energize the insulated electrical conductor in response to detecting the electromagnetic signal.

8. The electrical system of claim 1 further comprising:
   an acoustic sensor system configured to detect the electrical fault; and
   a processor coupled to the acoustic sensor system and the photo detector, the processor configured to determine the electrical fault has occurred based on both detection by the photo detector and detection by the acoustic sensor system.

9. An electrical fault detector, comprising:
   an optical fiber comprising a jacket surrounding an optical core, the optical fiber configured to be installed adjacent to an insulated electrical conductor installed in an aircraft and configured to conduct a current over a length of the insulated electrical conductor;
   a photo detector coupled to the optical fiber and configured to detect an electromagnetic signal carried by the optical fiber and at least partially generated as a function of an electrical fault that occurs at a point along the length of the insulated electrical conductor, the photo detector further configured to transmit an electrical signal indicative of detecting the electromagnetic signal; and
   a processor coupled to the photo detector and configured to receive the electrical signal and determine the electrical fault has occurred in response to the electrical signal.

10. The electrical fault detector of claim 9, wherein the jacket surrounding the optical core comprises a jacket material sensitive to heat and radiant energy emitted by the electrical fault and configured to degrade at a location proximate the electrical fault in response to the electrical fault.

11. The electrical fault detector of claim 10, wherein the jacket material is further configured to degrade in response to at least one of an electrical arc or a corona discharge, thereby at least partially generating the electromagnetic signal carried by the optical fiber.

12. The electrical fault detector of claim 9 further comprising an optical transmitter coupled to the optical fiber and coupled to the processor, the optical transmitter configured to transmit a base signal through the optical fiber, and wherein the processor is further configured to detect a difference between the base signal and the electromagnetic signal at least partially generated as a function of the electrical fault to determine the electrical fault has occurred.

13. The electrical fault detector of claim 9 further comprising an optical transmitter coupled to the optical fiber and coupled to the processor, the optical transmitter configured to transmit a measurement signal through the optical fiber in response to detecting the electromagnetic signal, and wherein the processor is further configured to determine a location of the electrical fault based on an optical time-domain reflectometry measurement using the measurement signal.

14. The electrical fault detector of claim 9 further comprising an optical transmitter coupled to the optical fiber and coupled to the processor, the optical transmitter configured to transmit an identification signal through the optical fiber in response to detecting the electromagnetic signal, the identification signal configured to illuminate a location of the electrical fault along the length of the insulated electrical conductor using at least one frequency band of light.

15. A method of detecting an electrical fault occurring at a point along a length of an insulated electrical conductor installed in an aircraft and configured to conduct a current over its length, the method comprising:
    installing an optical fiber adjacent to the insulated electrical conductor, the optical fiber having a jacket material configured to degrade at a location proximate the electrical fault in response to the electrical fault;
    receiving, at a photo detector coupled to the optical fiber, an electromagnetic signal carried by the optical fiber and at least partially generated as a function of the electrical fault;
    transmitting an electrical signal indicative of detecting the electromagnetic signal to a processor coupled to the photo detector; and
    determining, by the processor, the electrical fault has occurred in response to the electrical signal.

16. The method of claim 15 further comprising:
    transmitting, by an optical transmitter coupled to the optical fiber and the processor, a base signal through the optical fiber; and
    detecting, by the processor, a difference between the base signal and the electromagnetic signal at least partially generated as a function of the electrical fault to determine the electrical fault has occurred.

17. The method of claim 15 further comprising:
    transmitting, by an optical transmitter coupled to the optical fiber and the processor, a measurement signal through the optical fiber in response to determining the electrical fault has occurred; and
    determining, by the processor, a location of the electrical fault along the length of the insulated electrical conductor based on an optical time-domain reflectometry measurement using the measurement signal.

18. The method of claim 15 further comprising:
    transmitting, by an optical transmitter coupled to the optical fiber and the processor, an identification signal through the optical fiber in response to determining the electrical fault has occurred, the identification signal configured to illuminate a location of the electrical fault along the length of the insulated electrical conductor using at least one frequency band of light.

19. The method of claim 15 further comprising initiating a maintenance message for the insulated electrical conductor in response to determining the electrical fault has occurred.

20. The method of claim 15 further comprising de-energizing the insulated electrical conductor in response to determining the electrical fault has occurred.

* * * * *